United States Patent [19]

Pawar et al.

[11] Patent Number: 5,623,265

[45] Date of Patent: Apr. 22, 1997

[54] FLASH ANALOG-TO-DIGITAL CONVERTER AND METHOD OF OPERATION

[75] Inventors: Vivek J. Pawar, Bangalore, India; William R. Krenik, Garland, Tex.

[73] Assignee: Texas Instruments Incorporated, Dallas, Tex.

[21] Appl. No.: 188,299

[22] Filed: Jan. 28, 1994

[51] Int. Cl.[6] .................................................. H03M 1/36
[52] U.S. Cl. ........................................ 341/160; 341/159
[58] Field of Search .................................... 341/160, 155, 341/159, 161

[56] References Cited

U.S. PATENT DOCUMENTS

| | | | |
|---|---|---|---|
| 4,733,220 | 3/1988 | Knierim | 341/64 |
| 5,243,348 | 9/1993 | Jackson | 341/64 |

OTHER PUBLICATIONS

Declaration of Kerry Glover of Texas Instruments Incorporated dated Feb. 16, 1994.

Primary Examiner—Brian K. Young
Attorney, Agent, or Firm—W. Daniel Swayze, Jr.; W. James Brady, III; Richard L. Donaldson

[57] ABSTRACT

A flash analog-to-digital converter (8) is provided which includes a comparator array (10) which provides a thermometer code output THC1 through THC7. A binary search encoder (12) is coupled to the comparator array (8) as shown, and provides a binary code output B2 through B0.

20 Claims, 1 Drawing Sheet

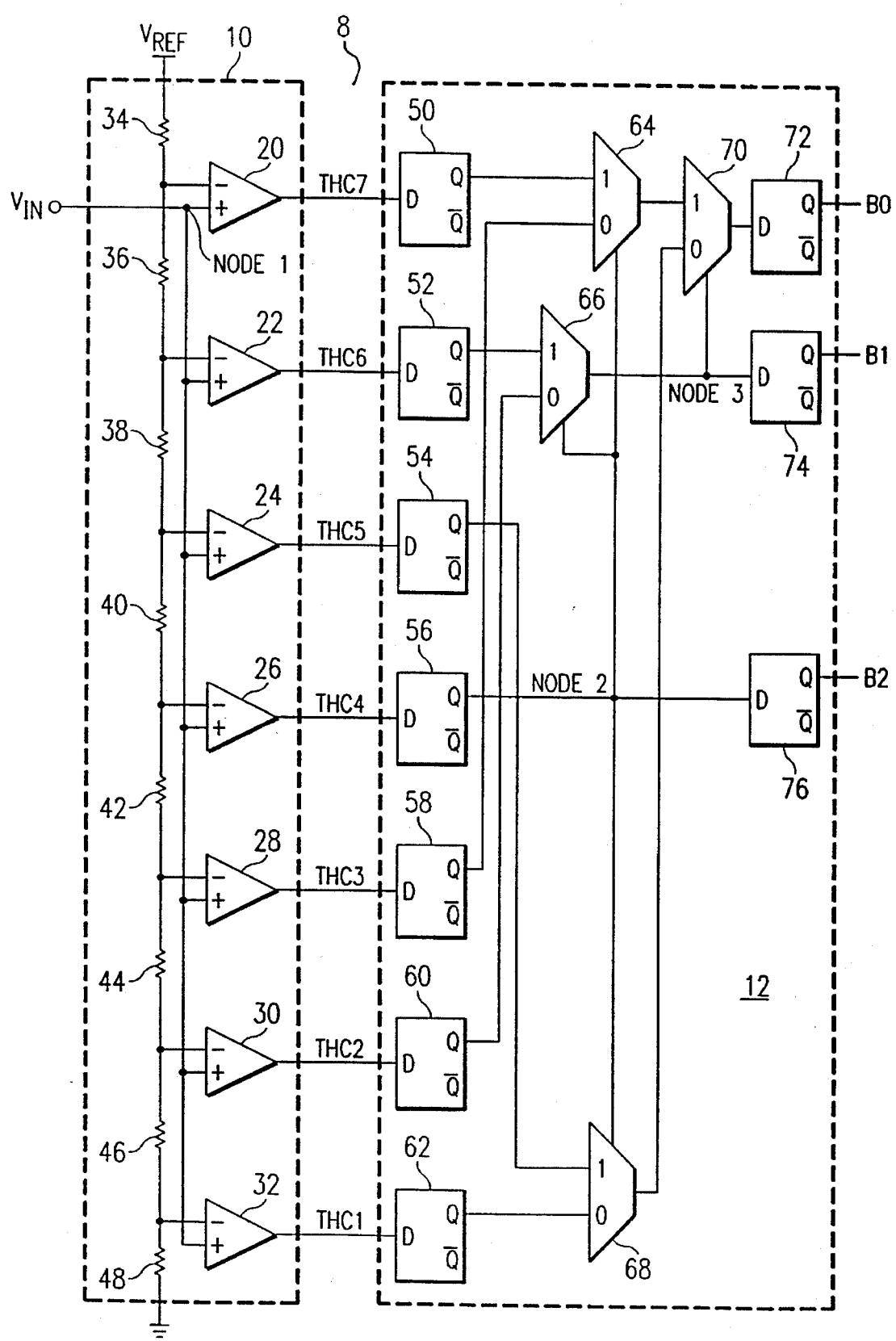

FLASH ANALOG-TO-DIGITAL CONVERTER AND METHOD OF OPERATION

TECHNICAL FIELD OF THE INVENTION

This invention relates in general to the field of electronic systems and more particularly to an improved flash analog-to-digital converter and method of operation.

BACKGROUND OF THE INVENTION

Integrated chip packages are widely used in many industries. An integrated chip package encases a semiconductor chip on which an integrated circuit has been constructed. An integrated chip package can be included in an electronic circuit to perform a wide variety of functions. The functions performed by an integrated chip package depends upon the integrated circuit which has been constructed on the semiconductor chip. An integrated circuit is composed of a number of integrated circuit elements which might include resistors, capacitors and transistors. An integrated circuit may include a collection of integrated circuit elements which constitute a flash analog-to-digital converter. Flash analog-to-digital converters operate to convert an analog voltage signal into a binary code representation of the magnitude of the analog voltage signal.

SUMMARY OF THE INVENTION

A need has arisen for an improved flash analog-to-digital converter and a method of operation.

In accordance with the present invention, an improved flash analog-to-digital converter is provided which substantially eliminates or reduces disadvantages and problems associated with prior flash analog-to-digital converters.

According to one embodiment of the present invention, a flash analog-to-digital converter is provided which comprises a comparator array having a first input and a first plurality of outputs. The comparator array is operable to provide a digital thermometer code on the first plurality of outputs which represents a magnitude of an analog voltage signal applied to the first input. The flash analog-to-digital converter also comprises a binary-search encoder having a first plurality of inputs and a second plurality of outputs. The first plurality of inputs are coupled to the first plurality of outputs from the comparator array. The binary-search encoder is operable to provide a binary code on the second plurality of outputs responsive to the thermometer code. The binary code represents the magnitude of the analog voltage signal.

According to another embodiment of the present invention, a method of converting an analog voltage signal to a binary code representation is provided which comprises a number of steps. The first step includes comparing a magnitude of the analog voltage signal to a plurality of voltage levels. The second step includes representing the magnitude of the analog voltage signal as a thermometer code. The final step includes converting the thermometer code to a binary code representation of the magnitude of the analog voltage signal by performing a binary search conversion on the thermometer code.

BRIEF DESCRIPTION OF THE DRAWINGS

A more complete understanding of the present invention may be acquired by referring to the following description taken in conjunction with the accompanying drawing wherein:

The FIGURE illustrates a flash analog-to-digital converter constructed according to the teachings of the present invention.

DETAILED DESCRIPTION OF THE INVENTION

In a conventional n-bit flash analog-to-digital converter (ADC), an analog voltage signal is converted to a binary code. The analog voltage signal is compared to a number of voltage levels subdividing a reference voltage using a comparator array. The output of the comparator array is a digital thermometer code (THC) with a length of $(2^n-1)$ bits. An ideal THC comprises all ones followed by all zeroes where the transition from one to zero represents the level of the analog voltage signal. In a conventional flash ADC, the THC is converted to a one-hot code (OHC) by detecting the transition from one to zero. Then, a read-only memory (ROM) is used to output a binary code corresponding to the OHC. Because of comparator offset mismatch, comparator metastability and input slew, there is high probability that the THC and hence the OHC are non-ideal. A non-ideal THC comprises more than one transition from one to zero. A non-ideal THC can cause errors at the output of a conventional flash ADC called sparkle error, glitch error, or misconversion error.

Conventional methods for reducing sparkle error in a flash ADC concentrate on the reduction of error in the THC to OHC conversion process. Conventional methods use a bubble correction method which is logic-based. Hence, if any comparator output from the comparator array is metastable, conventional methods will create multiple metastable outputs at the OHC, and sparkle errors are multiplied. Other conventional methods for reducing sparkle error concentrate on reduction of error in the OHC to binary code conversion process. These conventional methods suffer from the fact that errors are not being corrected early on, and also from the fact that there are probably more errors occurring during the THC to OHC conversion than during the OHC to binary code conversion. Furthermore, the grey code error generated in the grey-to-binary conversion is small, but the conversion speed is very slow.

A technical advantage of the present invention is the minimization of the maximum sparkle error. According to the teachings of the present invention, the implementation of binary search conversion in a binary-search encoder minimizes the sparkle error in a worst case scenario. The binary search conversion method is similar to the successive approximation principle, but it works in a digital domain instead of an analog domain. Binary search conversion involves a binary search. Hence, even if an error is made with one bit, the error tends later to be nullified.

The FIGURE illustrates flash analog-to-digital converter 8 constructed according to the teachings of the present invention. The flash analog-to-digital converter 8 comprises a comparator array 10 and a binary-search encoder 12. The comparator array 10 comprises a plurality of comparators, a plurality of resistors, an input and a plurality of outputs.

The comparator array 10 comprises seven comparators: comparator 20, comparator 22, comparator 24, comparator 26, comparator 28, comparator 30, and comparator 32. Each comparator comprises a plus-input, a minus-input, and an output. The plus-input of each comparator is connected to NODE 1.

An input analog voltage signal $V_{IN}$ is also connected to NODE 1. The comparator array 10 also comprises eight resistors: resistor 34, resistor 36, resistor 38, resistor 40, resistor 42, resistor 44, resistor 46, and resistor 48. Resistor 34 is connected to a reference voltage $V_{REF}$ and is connected to the minus-input of comparator 20. The resistor 36 is connected to the minus-input of the comparator 20 and to the minus-input of comparator 22. The resistor 38 is connected to the minus-input of comparator 22 and to the minus-input of comparator 24. The resistor 40 is connected to the minus-input of comparator 24 and to the minus-input of comparator 26. The resistor 42 is connected to the minus-input of comparator 26 and to the minus-input of comparator 28. The resistor 44 is connected to the minus-input of comparator 28 and to the minus-input of comparator 30. The resistor 46 is connected to the minus-input of comparator 30 and to the minus-input of comparator 32. The resistor 48 is connected to the minus-input of comparator 32 and to ground potential.

The outputs of the seven comparators comprise a digital thermometer code (THC). The output of comparator 20 is the most significant bit THC7 of the THC. The output of comparator 32 is the least significant bit THC1 of the THC. The output of comparator 22, comparator 24, comparator 26, comparator 28, and comparator 30 are THC6, THC5, THC4, THC3, and THC2, respectively.

The binary-search encoder 12 comprises a plurality of D-flipflops and a plurality of 2:1 multiplexers (MUXs). Each D-flipflop comprises a D-input, a Q-output and a $\overline{Q}$-output. Each MUX comprises a one-input, a zero-input, a selector-input and an output.

The binary-search encoder 12 comprises seven D-flipflops coupled to the outputs of the comparator array 10. The D-input of a D-flipflop 50 is connected to the output of comparator 20. The D-input of a D-flipflop 52 is connected to the output of comparator 22. The D-input of a D-flipflop 54 is connected to the output of comparator 24. The D-input of a D-flipflop 56 is connected to the output of comparator 26. The Q-output of D-flipflop 56 is connected to a second node NODE 2. The D-input of a D-flipflop 58 is connected to the output of comparator 28. The D-input of a D-flipflop 60 is connected to the output of a comparator 30, and the D-input of a D-flipflop 62 is connected to the output of comparator 32.

The binary-search encoder 12 comprises four 2:1 MUXs coupled to the Q-outputs of the seven D-flipflops described above. The one-input of a MUX 64 is connected to the Q-output of D-flipflop 50, and the zero-input is connected to the Q-output of D-flipflop 58. The one-input of a MUX 66 is connected to the Q-output of D-flipflop 52, and the zero-input is connected to the Q-output of D-flipflop 60. The one-input of a MUX 68 is connected to the Q-output of D-flipflop 54, and the zero-input is connected to the Q-output of D-flipflop 62. The selector inputs of MUX 64, MUX 66, and MUX 68 are connected to NODE 2. The one-input of a MUX 70 is connected to the output of MUX 64, and the MUX 70 has its zero-input connected to the output of MUX 68. The selector-input of MUX 70 is connected to a third node NODE 3. The output of MUX 66 is also connected to NODE 3.

The binary-search encoder 12 comprises three D-flipflops which provide outputs for the binary-search encoder 12. A D-flipflop 72 has its D-input connected to the output of MUX 70. A D-flipflop 74 has its D-input connected to NODE 3, and a D-flipflop 76 has its D-input connected to NODE 2. The outputs of D-flipflop 72, D-flipflop 74, and D-flipflop 76 comprise a binary code. The Q-output of D-flipflop 76 represents the most significant bit B2, and the Q-output of D-flipflop 72 represents the least significant bit B0. The Q-output of D-flipflop 74 represents the middle bit B1.

In operation, the flash analog-to-digital converter 8 converts the analog voltage signal $V_{IN}$ to a three-bit binary code represented by B2, B1, and B0. The eight resistors connected in series between $V_{REF}$ and ground potential establish eight voltage levels against which the magnitude of the analog voltage signal $V_{IN}$ is compared by the seven comparators. The output of each comparator is a zero if the magnitude of $V_{IN}$ is lower than the voltage level at the minus-input of the comparator. For example, if the magnitude of $V_{IN}$ is greater than $\frac{1}{2} V_{REF}$, but less than $\frac{5}{8} V_{REF}$, then assuming an ideal output, THC1 through THC4 are ones, and THC5 through THC7 are zeroes. In this manner, THC1 through THC7 represent the magnitude of the analog voltage signal $V_{IN}$ as one of eight levels ranging from "0000000" to "1111111".

The binary search encoder 12 operates to convert the thermometer code output by the comparator array 10 to a binary code representation of the magnitude of the analog voltage signal $V_{IN}$. A binary-search encoder is an encoder which implements a binary search conversion. The seven D-flipflops connected to the output of the comparator array 10 operate to latch the value of each bit in the thermometer code. The D-flipflops operate such that the Q-output of each D-flipflop is the logical equivalent of the input connected to the D-input of each D-flipflop. Thus, the outputs of D-flipflops 50 through 62 match the logical values of THC7 through THC1, respectively. Similarly, D-flipflops 72 through 76 provide a Q-output that is the logical equivalent of the input signal at the D-input of each D-flipflop. The four MUXs 64 through 70 operate to convert the thermometer code to a binary code representation by performing a binary search conversion on the thermometer code.

The three-bit binary code output by the binary search encoder 12 comprises eight possible levels ranging from "000" to "111" which correspond to the thermometer code levels "0000000" through "1111111", respectively. Thus, the binary code output of the binary search encoder 12 corresponds to the thermometer code output of the comparator array 10 as shown in the following table:

TABLE 1

| THERMOMETER CODE | | | | | | | BINARY CODE | | |
|---|---|---|---|---|---|---|---|---|---|
| THC1 | THC2 | THC3 | THC4 | THC5 | THC6 | THC7 | $B_2$ | $B_1$ | $B_0$ |
| 0 | 0 | 0 | 0 | 0 | 0 | 0 | 0 | 0 | 0 |
| 1 | 0 | 0 | 0 | 0 | 0 | 0 | 0 | 0 | 1 |
| 1 | 1 | 0 | 0 | 0 | 0 | 0 | 0 | 1 | 0 |
| 1 | 1 | 1 | 0 | 0 | 0 | 0 | 0 | 1 | 1 |
| 1 | 1 | 1 | 1 | 0 | 0 | 0 | 1 | 0 | 0 |

TABLE 1-continued

| THERMOMETER CODE | | | | | | | BINARY CODE | | |
|---|---|---|---|---|---|---|---|---|---|
| THC1 | THC2 | THC3 | THC4 | THC5 | THC6 | THC7 | $B_2$ | $B_1$ | $B_0$ |
| 1 | 1 | 1 | 1 | 1 | 0 | 0 | 1 | 0 | 1 |
| 1 | 1 | 1 | 1 | 1 | 1 | 0 | 1 | 1 | 0 |
| 1 | 1 | 1 | 1 | 1 | 1 | 1 | 1 | 1 | 1 |

The binary search conversion performed by the binary-search encoder 12 involves selecting the center bit of the thermometer code as B2, selecting B1 according to the value of B2, and selecting B0 according to the values of B2 and B1. B2 is set equal to THC4 which represents the most significant bit in the thermometer code. The fact that THC4 represents the most significant bit can be understood by referring to TABLE 1 and recognizing that the value of B2 matches the value of THC4. The value of B1 is set by MUX 66 using B2 to select either THC6 or THC2. If B2 (or THC4) is a one, then B1 equals THC6. If B2 is a zero, then B1 equals THC2. Thus, B2 determines whether the center bit of the top-half or the center bit of the bottom-half of the THC will be selected for B1.

MUX 64, MUX 68, and MUX 70 operate to select the value of B0. MUX 64 and MUX 68 use the value of B2 to select either THC bits in the top-half or in the bottom-half of the THC. MUX 64 selects either the top bit in the top-half, THC7, or the top bit in the bottom-half, THC3. If B2 is a one, MLIX 64 selects THC7. If B2 is a zero, MUX 64 selects THC3. Similarly, MUX 68 selects either the bottom bit of the top-half, THC5, or the bottom bit of the bottom-half, THC1. If B2 is a one, MUX 68 selects THC5. If B2 is a zero, MUX 68 selects THC1.

MUX 64, MUX 66, and MUX 68 comprise a first level of MUXs, all of which utilize B2 as the selector input. MUX 70 comprises a second level of MUXs, all of which utilize the value of B1 as the selector input. MUX 70 selects the output of MUX 64 when B1 is a one, and the MUX 70 selects the output of MUX 68 when B1 is a zero. MUX 64 and MUX 68 operate to provide to MUX 70 the top bit and bottom bit of either the top-half or bottom-half of the thermometer code. MUX 70 has as its inputs either THC7 and THC5 or THC3 and THC1. Thus, MUX 70 operates to select either the top bit or the bottom bit of the half of the thermometer code selected by MUX 64 and MUX 68. Beginning with the most significant bit of the binary code set to the center bit of the THC, MUX 64, MUX 66, MUX 68, and MUX 70 operate to perform a binary search conversion of the THC into a three-bit binary code representation of the magnitude analog voltage signal $V_{IN}$.

One technical advantage of a flash analog-to-digital converter constructed according to the teachings of the present invention is the reduction of the maximum sparkle error. This fact can be illustrated by reference to the flash analog-to-digital converter 8 illustrated in the figure. The worst case sparkle error occurs when the most significant bit THC4 is a zero when it should be a one. For example, the thermometer code equals "1110100" in a non-ideal case producing the worst case sparkle error. This is a non-ideal thermometer code with one bubble where the correct thermometer code is "1111000". The following table illustrates that the binary code output by the binary-search encoder 12 of the figure produces a worst case error of one.

TABLE 2

| Analog Voltage Input | Ideal Thermometer Code | Non-Ideal Thermometer Code | Binary Code |
|---|---|---|---|
| Equal to level four (100) | 1111000 | 1110100 | 011 |

Thus, even in the worst case scenario, the flash analog-to-digital converter 8 of the figure outputs a binary code which is incorrect only by one level. This reduction of sparkle error is attributable to the binary search encoder 12.

A binary-search encoder performing a binary search conversion on thermometer code can be implemented for any size flash analog-to-digital converter. The figure illustrates a three-bit flash analog-to-digital converter 8, but the teachings of the present invention can be utilized for a binary search encoder in a flash analog-to-digital converter with any number of bits.

In one possible embodiment, the binary-search encoder comprises a D-flipflop for each bit in the thermometer code to latch the input of the binary-search encoder, and a number of D-flipflops equal to the number of output bits to latch the output. The number of 2:1 MUXs needed in a binary-search encoder depends upon the number of bits in the binary code output. The most significant output bit (MSB) requires no MUXs. The next bit, MSB-1, requires one MUX using the MSB as a selector input. The third bit, MSB-2, requires two MUXs using the MSB as a selector input and one MUX using the MSB-1 as a selector input. The fourth bit, MSB-3, requires four MUXs using the MSB as a selector input, two MUXs using the MSB-1 as a selector input, and one MUX using the MSB-2 as a selector input. This pattern could be continued for as many bits as necessary. The implementation of a binary-search conversion is not limited to 2:1 MUXs, but could include other MUXs.

The following table illustrates binary search conversion for the four most significant bits of an n-bit flash analog-to-digital converter. In the table, B(n−1) is the most significant bit of the binary code output by the binary-search encoder. The formulas following "THC" identify a particular THC bit. For example, if n=4, then "THC ½($2_n$)" refers to THC8.

TABLE 3

| Binary Code | Binary Search Conversion | | | | | | | |
|---|---|---|---|---|---|---|---|---|
| B(n−1) | \multicolumn{8}{c}{THC 1/2 ($2^n$)} |
| | \multicolumn{4}{c}{0} | \multicolumn{4}{c}{1} |
| B(n−2) | \multicolumn{4}{c}{THC 1/4 ($2^n$)} | \multicolumn{4}{c}{THC 3/4 ($2^n$)} |
| | \multicolumn{2}{c}{0} | \multicolumn{2}{c}{1} | \multicolumn{2}{c}{0} | \multicolumn{2}{c}{1} |
| B(n−3) | \multicolumn{2}{c}{THC 1/8 ($2^n$)} | \multicolumn{2}{c}{THC 3/8 ($2^n$)} | \multicolumn{2}{c}{THC 5/8 ($2^n$)} | \multicolumn{2}{c}{THC 7/8 ($2^n$)} |
| | 0 | 1 | 0 | 1 | 0 | 1 | 0 | 1 |
| B(n−4) | THC 1/16 ($2^n$) | THC 3/16 ($2^n$) | THC 5/16 ($2^n$) | THC 7/16 ($2^n$) | THC 9/16 ($2^n$) | THC 11/16 ($2^n$) | THC 13/16 ($2^n$) | THC 15/16 ($2^n$) |
| | 0   1 | 0   1 | 0   1 | 0   1 | 0   1 | 0   1 | 0   1 | 0   1 |
| ••• | ••• | | | | | | | |

Table 3 shows from which THC bits each output bit of the binary code is selected and how the selection is made. The most significant bit is B(n−1). The value of B(n−1) is set to the value of THC ½($2^n$). If n=4, THC ½ ($2^n$) would be THC8. The value of B(n−1) is either a zero or a one.

The value of B(n−2) is set either to THC ¼($2^n$) or to THC ¾($2^n$). If n=4, B(n−2) will be set either to THC4 or THC12. It can be seen from Table 3 that one 2:1 MUX is needed to select either THC ¼($2^n$) or THC ¾($2^n$), using the value of B(n−1) as a selector.

The value of B(n−3) is set to THC ⅛($2^n$), THC ⅜($2^n$), THC ⅝($2^n$), or THC ⅞($2^n$). The selection for B(n−3) depends upon the value of B(n−1) and the value of B(n−2). For example, if B(n−1)=0 and B(n−2)=1, B(n−3) is set to the value of THC ⅜($2^n$). It can be seen from Table 3 that the selection of B(n−3) requires three 2:1 MUXs. One 2:1 MUX using B(n−1) as a selector-input selects between THC ⅛($2^n$) and THC ⅝($2^n$). Similarly, a second MUX using B(n−1) as a selector-input selects between THC ⅜($2^n$) and THC ⅞($2^n$). Thus, these first two MUXs select either top-half or bottom-half THC bits. A third 2:1 MUX selects between the two outputs of the first two MUXs using the value of B(n−2) as the selector input.

This binary search conversion continues until all of the bits and the binary code have been selected. It can be seen that the number of 2:1 MUXs needed to select the value for each bit in the binary code after B(n−1) depends upon the number of levels below B(n−1). For example, B(n−3) is two levels below the most significant bit B(n−1) and requires three 2:1 MUXs to be selected. The number of 2:1 MUXs needed can be stated generally as follows:

The number of 2:1 MUXs equals $$\sum_{i=0}^{K-1} 2^i$$

where K is equal to the number of levels below B(n−1). According to the above equation, seven 2:1 MUXs are needed to select B(n−4), for which K=3. Clearly, other implementations of a binary search conversion system operable to select an appropriate thermometer code bit may utilize circuit elements other than 2:1 MUXs. The above description is only for the purpose of explaining a binary search conversion according to one possible implementation.

Although the present invention has been described in detail, it should be understood that various changes, substitutions and alterations can be made hereto without departing from the spirit and scope of the present invention as defined by the appended claims.

What is claimed is:

1. A flash analog-to-digital converter comprising:

a comparator array having a first input and a first plurality of outputs, the comparator array operable to provide a digital thermometer code on the first plurality of outputs representing a magnitude of an analog voltage signal applied to the first input; and a bisection-search encoder having a first plurality of inputs and a second plurality of outputs, the first plurality of inputs coupled to the first plurality of outputs, wherein the bisection-search encoder is operable to provide a binary code on the second plurality of outputs responsive to a bisection-search of the thermometer code, the binary code representing the magnitude of the analog voltage signal.

2. The flash analog-to-digital converter of claim 1, wherein the comparator array comprises:

a plurality of resistors connected in series between a reference voltage and ground potential forming a plurality of nodes disposed between the resistors, wherein each node in the plurality of nodes carries one of a plurality of voltage levels; and a plurality of comparators, wherein each comparator in the plurality of comparators comprises a plus-input, a minus-input and an output, and wherein each plus-input is coupled to the analog input voltage, each minus-input is coupled to a different one of the plurality of nodes, and each output comprises one of the first plurality of outputs.

3. A flash analog-to-digital converter comprising:

a comparator array having a first input and a first plurality of outputs, the comparator array operable to provide a digital thermometer code on the first plurality of outputs representing a magnitude of an analog voltage signal applied to the first input; and a binary encoder having a first plurality of inputs and a second plurality of outputs, the first plurality of inputs coupled to the first plurality of outputs, wherein the binary encoder is operable to provide a binary code on the second plurality of outputs responsive to the thermometer code, the binary code representing the magnitude of the analog voltage signal, wherein the binary encoder comprises:

a first plurality of latches, wherein each latch in the first plurality of latches comprises a first input and a first output, the first input of each latch in the first plurality of latches coupled to one of the first plurality of outputs of the comparator array;

a plurality of multiplexers operable to implement a binary search conversion to convert the thermometer code to the binary code and operable to provide a plurality of signals representing the binary code, wherein the plurality of multiplexers are coupled to the first outputs of the first plurality of latches; and a second plurality of latches, wherein each latch in the second plurality of latches comprises a second input and a second output, the second input of each latch in the second plurality of latches coupled to one of the plurality of signals and the second output of each latch in the second plurality of latches comprising one bit of the binary code.

4. A flash analog-to-digital converter comprising;

a comparator array having a first input and a first plurality of outputs, the comparator array operable to provide a digital thermometer code on the first plurality of outputs representing a magnitude of an analog voltage signal applied to the first input; and a binary encoder having a first plurality of inputs and a second plurality of outputs, the first plurality of inputs coupled to the first plurality of outputs, wherein the binary encoder is operable to provide a binary code on the second plurality of outputs responsive to the thermometer code, the binary code representing the magnitude of the analog voltage signal, wherein the binary encoder comprises:

a first plurality of D-flipflops, wherein each D-flipflop in the first plurality of D-flipflops comprises a first D-input and a first Q-output, the first D-input of each D-flipflop in the first plurality of D-flipflops coupled to one of the first plurality of outputs of the comparator array;

a plurality of multiplexers operable to implement a binary search conversion to convert the thermometer code to the binary code and operable to provide a plurality of signals representing the binary code, wherein the plurality of multiplexers are coupled to the first Q-outputs of the first plurality of D-flipflops; and a second plurality of D-flipflops, wherein each D-flipflop in the second plurality of D-flipflops comprises a second D-input and a second Q-output, the second D-input of each D-flipflop in the second plurality of D-flipflops coupled to one of the plurality of signals and the second Q-output of each D-flipflop in the second plurality of D-flipflops comprising one bit of the binary code.

5. A flash analog-to-digital converter comprising:

a comparator array having a first input and a first plurality of outputs, the comparator array operable to provide a digital thermometer code on the first plurality of outputs representing a magnitude of an analog voltage signal applied to the first input; and a binary encoder having a first plurality of inputs and a second plurality of outputs, the first plurality of inputs coupled to the first plurality of outputs, wherein the binary encoder is operable to provide a binary code on the second plurality of outputs responsive to the thermometer code, the binary code representing the magnitude of the analog voltage signal, wherein the binary encoder comprises:

a first plurality of latches, wherein each latch in the first plurality of latches comprises a first input and a first output, the first input of each coupled to one of the first plurality of outputs of the comparator array;

a plurality of 2:1 multiplexers operable to implement a binary search conversion to convert the thermometer code to the binary code and operable to provide a plurality of signals representing the binary code, wherein each 2:1 multiplexer comprises a one-input, a zero-input, a selector-input and an output, and wherein the plurality of 2:1 multiplexers are coupled to the first outputs of the first plurality of latches;

a second plurality of latches, wherein each latch in the second plurality of latches comprises a second input and a second output, the second input of each latch in the second plurality of latches coupled to one of the plurality of signals and the second output of each latch in the second plurality of latches comprising one bit of the binary code.

6. The flash analog-to-digital converter of claim 1, wherein the flash analog-to-digital converter comprises a three-bit flash analog-to-digital converter.

7. The flash analog-to-digital converter of claim 1, wherein the flash analog-to-digital converter comprises an integrated circuit.

8. An integrated circuit on a semiconductor chip in an integrated chip package, comprising:

a plurality of integrated circuit elements operable to provide an analog voltage signal; and a flash analog-to-digital converter comprising;

a comparator array having a first input and a first plurality of outputs, the first input coupled to the analog voltage signal, wherein the comparator array is operable to provide a digital thermometer code on the first plurality of outputs representing a magnitude of the analog voltage signal; and a bisection-search encoder having a first plurality of inputs and a second plurality of outputs, the first plurality of inputs coupled to the first plurality of outputs, wherein the binary bisection encoder is operable to provide a binary code on the second plurality of outputs responsive to a bisection-search of the thermometer code, the binary code representing the magnitude of the analog voltage signal.

9. The flash analog-to-digital converter of claim 8, wherein the comparator array comprises:

a plurality of resistors connected in series between a reference voltage and ground potential forming a plurality of nodes disposed between the resistors, wherein each node in the plurality of nodes carries one of a plurality of voltage levels; and a plurality of comparators, wherein each comparator in the plurality of comparators comprises a plus-input, a minus-input and an output, and wherein each plus-input is coupled to the analog input voltage, each minus-input is coupled to a different one of the plurality of nodes, and each output comprises one of the first plurality of outputs.

10. An integrated circuit on a semiconductor chip in an integrated chip package, comprising:

a plurality of integrated circuit elements operable to provide an analog voltage signal; and a flash analog-to-digital converter comprising;

a comparator array having a first input and a first plurality of outputs, the first input coupled to the analog voltage signal, wherein the comparator array is operable to provide a digital thermometer code on the first plurality of outputs representing a magnitude of the analog voltage signal; and a binary encoder having a first plurality of inputs and a second plurality of outputs, the first plurality of inputs coupled to the first plurality of outputs, wherein the binary encoder is operable to provide a binary code on the second plurality of outputs responsive to the thermometer code, the binary code representing the magnitude of the analog voltage signal, wherein the binary encoder comprises:

a first plurality of latches, wherein each latch in the first plurality of latches comprises a first input and a first output, the first input of each latch in the first plurality of latches coupled to one of the first plurality of outputs of the comparator array;

a plurality of multiplexers operable to implement a binary search conversion to convert the thermometer code to the binary code and operable to provide a plurality of signals representing the binary code, wherein the plurality of multiplexers are coupled to the first outputs of the first plurality of latches; and a second plurality of latches, wherein each latch in the second plurality of latches comprises a second input and a second output, the second input of each latch in the second plurality of latches coupled to one of the plurality of signals and the second output of each latch in the second plurality of latches comprising one bit of the binary code.

11. An integrated circuit on a semiconductor chip in an integrated chip package, comprising:

a plurality of integrated circuit elements operable to provide an analog voltage signal; and a flash analog-to-digital converter comprising;

a comparator array having, a first input and a first plurality of outputs, the input coupled to the analog voltage signal, wherein the comparator array is operable to provide a digital thermometer code on the first plurality of outputs representing a magnitude of the analog voltage signal; and a binary encoder having a first plurality of inputs and a second plurality of outputs, the first plurality of inputs coupled to the first plurality of outputs, wherein the binary encoder is operable to provide a binary code on the second plurality of outputs responsive to the thermometer code, the binary code representing the magnitude of the analog voltage signal, wherein the binary encoder comprises:

a first plurality of D-flipflops, wherein each D-flipflop in the first plurality of D-flipflops comprises a first D-input and a first Q-output, the first D-input of each D-flipflop in the first plurality of D-flipflops coupled to one of the first plurality of outputs of the comparator array;

a plurality of multiplexers operable to implement a binary search conversion to convert the thermometer code to the binary code and operable to provide a plurality of signals representing the binary code, wherein the plurality of multiplexers are coupled to the first Q-outputs of the first plurality of D-flipflops; and a second plurality of D-flipflops, wherein each D-flipflop in the second plurality of D-flipflops comprises a second D-input and a second Q-output, the second D-input of each D-flipflop in the second plurality of D-flipflops coupled to one of the plurality of signals and the second Q-output of each D-flipflop in the second plurality of D-flipflops comprising one bit of the binary code.

12. An integrated circuit on a semiconductor chip in an integrated chip packages, comprising:

a plurality of integrated circuit elements operable to provide an analog voltage signal; and a flash analog-to-digital converter comprising:

a comparator array having a first input and a first plurality of outputs, the first input coupled to the analog voltage signal, wherein the comparator array is operable to provide a digital thermometer code on the first plurality of outputs representing a magnitude of the analog voltage signal; and a binary encoder having a first plurality of inputs and a second plurality of outputs the first plurality of inputs coupled to the first plurality of outputs, wherein the binary encoder is operable to provide a binary code on the second plurality of outputs responsive to the thermometer code, the binary code representing the magnitude of the analog voltage signal, wherein the binary encoder comprises:

a first plurality of latches, wherein each latch in the first plurality of latches comprises a first input and a first output, the first input of each coupled to one of the first plurality of outputs of the comparator array;

a plurality of 2:1 multiplexers operable to implement a binary search conversion to convert the thermometer code to the binary code and operable to provide a plurality of signals representing the binary code, wherein each 2:1 multiplexer comprises a one-input, a zero-input, a selector-input and an output, and wherein the plurality of 2:1 multiplexers are coupled to the first outputs of the first plurality of latches;

a second plurality of latches, wherein each latch in the second plurality of latches comprises a second input and a second output, the second input of each latch in the second plurality of latches coupled to one of the plurality of signals and the second output of each latch in the second plurality of latches comprising one bit of the binary code.

13. The flash analog-to-digital converter of claim 8, wherein the flash analog-to-digital converter comprises a three-bit flash analog-to-digital converter.

14. A method of converting an analog voltage signal to a binary code representation, comprising the steps of:

comparing a magnitude of an analog voltage signal to a plurality of voltage levels;

representing the magnitude of the analog voltage signal as a thermometer code; and converting the thermometer code to a binary code representation of the magnitude of the analog voltage signal by performing a bisection-search conversion on the thermometer code.

15. A method of converting an analog voltage signal to a binary code representation, comprising the steps of:

comparing a magnitude of an analog voltage signal to a plurality of voltage levels;

representing the magnitude of the analog voltage signal as a thermometer code; and converting the thermometer code to a binary code representation of the magnitude of the analog voltage signal by performing a binary conversion on the thermometer code, wherein the step of converting comprises the steps of:

latching each bit of the thermometer code;

performing a binary conversion on the thermometer code;

providing a plurality of signals representing the binary code; and latching the plurality of signals to output the binary code.

16. The method of claim 14, wherein the step of comparing comprises comparing the analog voltage signal to eight voltage levels, the step of representing comprises representing the magnitude of the analog voltage signal as a seven-bit thermometer code, and the step of converting comprises converting the thermometer code to a three-bit binary code.

17. The method of claim 14, wherein the step of comparing is accomplished by a comparator array.

18. The method of claim 14, wherein the step of representing is accomplished by a comparator array.

19. The method of claim 14, wherein the step of converting is accomplished by a binary-search encoder.

20. The method of claim 14, wherein the steps of comparing, representing and converting are accomplished by an integrated circuit.

* * * * *